United States Patent
Lamesch

(10) Patent No.: US 10,797,663 B2
(45) Date of Patent: Oct. 6, 2020

(54) CAPACITIVE LOADING MODE MEASUREMENT CIRCUIT WITH COMPENSATION OF MEASUREMENT ERRORS DUE TO PARASITIC SENSOR IMPEDANCES

(71) Applicant: IEE INTERNATIONAL ELECTRONICS & ENGINEERING S.A., Echternach (LU)

(72) Inventor: Laurent Lamesch, Reichlange (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 169 days.

(21) Appl. No.: 16/062,473

(22) PCT Filed: Dec. 9, 2016

(86) PCT No.: PCT/EP2016/080372
§ 371 (c)(1),
(2) Date: Jun. 14, 2018

(87) PCT Pub. No.: WO2017/102572
PCT Pub. Date: Jun. 22, 2017

(65) Prior Publication Data
US 2018/0358941 A1 Dec. 13, 2018

(30) Foreign Application Priority Data
Dec. 18, 2015 (LU) .......................................... 92918

(51) Int. Cl.
*G01D 5/24* (2006.01)
*G01R 27/14* (2006.01)
(Continued)

(52) U.S. Cl.
CPC .......... *H03F 3/45475* (2013.01); *G01D 5/24* (2013.01); *G01R 27/14* (2013.01); *H03F 3/38* (2013.01);
(Continued)

(58) Field of Classification Search
CPC .......... H03F 3/45; H03F 3/45475; H03F 3/38; H03F 3/387; H03F 2200/261;
(Continued)

(56) References Cited

U.S. PATENT DOCUMENTS 5,065,105 A * 11/1991 Bruere .................... G01B 7/023
324/662
8,269,512 B2 * 9/2012 Ootaka ............. B60R 21/01532
297/217.3
(Continued)

FOREIGN PATENT DOCUMENTS

FR 2784179 A1 4/2000
WO WO2014166780 A1 10/2014

OTHER PUBLICATIONS

International Search Report for international application No. PCT/EP2016/080372, dated Jan. 11, 2017, 2 pages.
(Continued)

*Primary Examiner* — Son T Le
(74) *Attorney, Agent, or Firm* — Reising Ethington P.C.

(57) ABSTRACT

An impedance measurement circuit for determining a sense current of a guard-sense capacitive sensor operated in loading mode. The circuit includes a periodic signal voltage source for providing a periodic measurement voltage, a sense current measurement circuit, a differential amplifier that is configured to sense a complex voltage difference between the sense electrode and the guard electrode, a demodulator for obtaining, with reference to the periodic measurement voltage, an in-phase component and a quadra-
(Continued)

ture component of the sensed complex voltage difference, and control loops for receiving the in-phase component and the quadrature component, respectively. An output signal of the first control loop and an output signal of the second control loop are usable to form a complex voltage that serves as a complex reference voltage for the sense current measurement circuit.

12 Claims, 5 Drawing Sheets

(51) Int. Cl.
*H03F 3/45* (2006.01)
*H03F 3/38* (2006.01)
*H03F 3/387* (2006.01)
*B60R 21/015* (2006.01)
*B60N 2/00* (2006.01)

(52) U.S. Cl.
CPC .............. *H03F 3/387* (2013.01); *B60N 2/002* (2013.01); *B60R 21/01532* (2014.10); *H03F 2200/129* (2013.01); *H03F 2200/135* (2013.01); *H03F 2200/144* (2013.01); *H03F 2200/261* (2013.01); *H03F 2200/264* (2013.01); *H03F 2200/321* (2013.01); *H03F 2200/336* (2013.01); *H03F 2200/393* (2013.01); *H03F 2200/462* (2013.01); *H03F 2200/471* (2013.01); *H03F 2203/45114* (2013.01); *H03F 2203/45116* (2013.01); *H03F 2203/45138* (2013.01); *H03F 2203/45151* (2013.01); *H03F 2203/45174* (2013.01); *H03F 2203/45224* (2013.01); *H03F 2203/45276* (2013.01); *H03F 2203/45512* (2013.01); *H03F 2203/45521* (2013.01); *H03F 2203/45528* (2013.01); *H03F 2203/45594* (2013.01)

(58) Field of Classification Search
CPC ..... H03F 2200/135; H03F 2203/45224; H03F 2203/45114; H03F 2200/129; H03F 2200/144; H03F 2200/264; H03F 2200/321; H03F 2200/336; H03F 2200/393; H03F 2200/462; H03F 2200/471; H03F 2203/45116; H03F 2203/45138; H03F 2203/45151; H03F 2203/45174; H03F 2203/45276; H03F 2203/45512; H03F 2203/45521; H03F 2203/45528; H03F 2203/45594; G01R 27/14; G01D 5/24; B60R 21/015; B60R 21/01532; B60N 2/00; B60N 2/002
See application file for complete search history.

(56) References Cited

U.S. PATENT DOCUMENTS

| 8,354,936 | B2 | 1/2013 | Ootaka | |
| 2005/0078768 | A1* | 4/2005 | Sun | ................... H04L 27/2626 375/297 |
| 2010/0283539 | A1* | 11/2010 | Yanagisawa | ....... G01R 19/2503 330/127 |

OTHER PUBLICATIONS

Written Opinion for international application No. PCT/EP2016/080372, dated Dec. 9, 2016, 7 pages.
Smith, J.R et al., Electric Field Sensing for Graphical Interfaces, IEEE Computer Graphics and Applications, 18(3) 1998, pp. 54-60.

* cited by examiner

PRIOR ART

CAPACITIVE LOADING MODE MEASUREMENT CIRCUIT WITH COMPENSATION OF MEASUREMENT ERRORS DUE TO PARASITIC SENSOR IMPEDANCES

TECHNICAL FIELD

The invention relates to an impedance measurement circuit for determining a sense current of a guard-sense capacitive sensor operated in loading mode, and a method for determining a sense current of a guard-sense capacitive sensor operated in loading mode.

BACKGROUND OF THE INVENTION

Capacitive vehicle seat occupancy detection systems comprising capacitive sensors operated in loading mode are nowadays widely used. The capacitive sensors may be designed as sense-only capacitive sensors having a single sense electrode. Also, quite often capacitive sensors are used that comprise a sense electrode and a guard electrode that are proximally arranged and mutually insulated from each other. This technique of "guarding" is well known in the art and is frequently used for intentionally masking, and thus shaping, a sensitivity regime of a capacitive sensor. To this end, the guard-sense capacitive sensor includes a capacitance measurement circuit that is configured to keep the guard electrode at the same electric potential as the sense electrode, As a result, a space between the sense electrode and the guard electrode is free of an electric field, and the guard-sense capacitive sensor is insensitive in a direction between the sense electrode and the guard electrode.

For example, patent document U.S. Pat. No. 8,354,936 B2 describes a capacitive passenger detector for a vehicle. The capacitive passenger detector includes a main electrode, a sub-electrode and a guard electrode. The main electrode and the sub-electrode are separated apart from each other, and disposed in a seat of a vehicle. The guard electrode is disposed between the main electrode and a body of the vehicle, and separated apart from the main electrode. A sensitive characteristic measurement unit is configured for applying an alternating voltage signal to the main electrode, the sub-electrode and the guard electrode selectively or totally and for converting a current generated in the main electrode, the sub-electrode and the guard electrode to a voltage, respectively. The capacitive passenger detector further comprises a controller that defines a current flowing through the guard electrode to be a reference current when a voltage of the main electrode and a voltage of the guard electrode have the same potential. The controller defines a current flowing direction of the current flowing through the guard electrode to be a negative direction when the voltage of the main electrode is higher than the voltage of the guard electrode. The controller defines the current flowing direction of the current flowing through the guard electrode to be a positive direction when the voltage of the main electrode is lower than the voltage of the guard electrode. The controller corrects the voltage of the main electrode based on the current flowing through the guard electrode so that a corrected voltage of the main electrode is set to be a passenger determination data. Even when a potential difference is generated between the main electrode and the guard electrode, the controller detects the capacitance of the passenger correctly.

A capacitive sensor with sense electrode (in the following also denoted as "sense") and guard electrode (in the following also denoted as "guard") has parasitic impedances, which systematically affect a measurement accuracy of the unknown impedance to be measured by determining a sense current of a guard-sense capacitive sensor. These impedances include, but are not limited to:
- a sense-to-guard impedance,
- a guard-to-ground impedance,
- a sense-to-sense current measurement circuit impedance, and
- a guard-to-signal voltage source impedance.

FIG. 1 illustrates an electric circuit diagram of a guard-sense capacitive sensor operated in loading mode and being connected to a conventional impedance measurement circuit for determining a sense current of the guard-sense capacitive sensor.

The term "loading mode", as used in this application, shall be understood particularly as a mode of measuring a displacement current caused by the presence of a grounded object in proximity of a single sense electrode (cf. J. Smith et al., *Electric field sensing for graphical interfaces*, IEEE Comput. Graph. Appl., 18(3):54-60, 1998).

If a grounded object is approaching the sense electrode, the current flowing between the electrode and ground is increased, indicating a presence of the object.

Referring now to FIG. 1, a guard-sense capacitive sensor 1 with wiring is shown being connected to a conventional impedance measurement circuit 2 for determining a sense current of the guard-sense capacitive sensor 1. An object that approaches the sense electrode or moves away from it causes a change of the sensed current that is symbolized by an unknown impedance 3. The parasitic impedances are the sense-to-guard impedance 4, the guard-to-ground impedance 5, the sense-to-sense current measurement circuit impedance 6 and the guard-to-signal voltage source impedance 7.

The unknown impedance 3 is electrically connected in parallel to the sense-to-guard impedance 4 and the guard-to-ground impedance 5, which are connected in series.

A periodic signal voltage source 11, which may for example be designed as a sine wave source, is configured to provide a periodic measurement voltage to the guard-to-ground impedance 5 via the guard-to-signal voltage source impedance 7.

The sense current measurement circuit 8, comprising an ideal current measurement device 9 and an internal impedance 10, is electrically connected between the sense-to-sense current measurement circuit impedance 6 and an output port of the periodic signal voltage source 11.

The unknown current to be sensed is the current through the unknown impedance 3. Ideally, this current should be identical to a current flowing through the sense current measurement circuit 8. However, due to the impedances 4, 5, 6, 7, 10, a substantial part of the unknown current to be sensed is deviated through the sense-to-guard impedance 4, thereby creating a systematic measurement error.

Document FR 2 784 179 A1 discloses an impedance measurement circuit for determining a sense current of a capacitive sensor operated in loading mode. The disclosed circuit uses a transformer in order to perform a loading mode measurement with a ground-referenced transimpedance amplifier.

SUMMARY

It is an object of the invention to provide an impedance measurement circuit for determining a sense current of a guard-sense capacitive sensor operated in loading mode with a reduced systematic error of measurement.

In one aspect of the present invention, the object is achieved by an impedance measurement circuit for determining a sense current of a guard-sense capacitive sensor operated in loading mode, which comprises a guard-sense capacitive sensor including an electrically conductive sense electrode and an electrically conductive guard electrode proximally arranged and mutually galvanically separated from each other.

The impedance measurement circuit includes
a periodic signal voltage source for providing a periodic measurement voltage to the guard electrode,
a sense current measurement circuit that is configured to determine a current flowing through the sense electrode that is indicative of an unknown impedance and represents a position of an object relative to the sense electrode,
a differential amplifier that is configured to sense a complex voltage difference between the sense electrode and the guard electrode,
demodulation means that are configured for demodulating an output signal of the differential amplifier and for obtaining, with reference to the periodic measurement voltage, an in-phase component and a quadrature component, and
a first control loop that is configured to receive the in-phase component as an input signal, and a second control loop that is configured to receive the quadrature component as an input signal.

An output signal of the first control loop and an output signal of the second control loop are usable to form a complex voltage that serves as a complex reference voltage for the sense current measurement circuit.

The term "galvanically separated", as used in this application, shall particularly be understood to not conduct a direct current (DC) between galvanically separated objects.

The term "proximally arranged", as used in this application, shall particularly be understood to be arranged in a distance that is small in comparison to at least one dimension of extension of either the sense electrode or the guard electrode.

The invention is based on the insight that a momentary and time-varying effect of the above-described parasitic impedances can be compensated in real time at least to a large extent by the two control loops that ensure that a complex voltage difference between the sense electrode and the guard electrode is substantially reduced to zero volts amplitude and a phase shift of 0°. By that, the unknown sense current to be measured is effectively prevented from flowing into the guard electrode, and is substantially entirely flowing into the sense measurement circuit, resulting in a highly reduced systematic measurement error.

In a preferred embodiment of the impedance measurement circuit, the first control loop includes a first integrating amplifier that is configured to generate a first error signal with reference to a direct current (DC) reference voltage, and the second control loop includes a second integrating amplifier that is configured to generate a second error signal with reference to the DC reference voltage. In this way, the error signals can be obtained with little hardware effort and in a cost-effective manner.

In another preferred embodiment of the impedance measurement circuit, the first control loop further includes a first mixer that is configured to multiply the first error signal and the periodic measurement voltage and the second control loop further includes a second mixer that is configured to multiply the second error signal and a quadrature phase of the periodic measurement voltage. In this way, a separation of an in-phase portion of the error signal and a quadrature portion of the error signals can be readily facilitated.

In yet another preferred embodiment, the impedance measurement circuit further comprises a summing circuit that is configured for at least summing the output signal of the first control loop and the output signal of the second control loop to form the complex voltage that serves as the complex reference voltage for the sense current measurement circuit. In a possible embodiment, the summing circuit may be configured for summing the output signal of the first control loop, the output signal of the second control loop and the periodic signal voltage source to form the complex voltage that serves as the complex reference voltage for the sense current measurement circuit. Preferably, the summing circuit comprises a summing operational amplifier to whose inverting input port the output signal of the first control loop and the output signal of the second control loop are fed via resistors. In this way, the complex reference voltage can be provided in a hardware-saving and cost-effective manner.

If the summing circuit includes a summing amplifier that comprises three input resistors, and an output port of the first mixer, an output port of the second mixer and the periodic signal voltage source are each electrically connected to a different one of the three input resistors, requirements regarding a dynamic range of output signals of the control loops can be reduced, which can allow for a more cost-effective implementation.

The term "electrically connected", as used in this application, shall be understood to encompass galvanic electrical connections as well as connections established by capacitive and/or inductive electromagnetic coupling.

In another preferred embodiment, the impedance measurement circuit further includes a microcontroller. The microcontroller comprises a processor unit, a digital data memory unit, to which the processor unit has data access, a microcontroller system clock and a plurality of synchronized pulse width modulation units configured to provide square wave output signals. The periodic signal voltage source is formed by a pulse generator unit that is configured to weight and to sum output signals of the plurality of synchronized pulse width modulation units having same fundamental signal frequency, and a low-pass filter unit that is connected in series to an output of the pulse generator unit and that is configured to filter the summed output signals for generating the periodic measurement voltage. In this way, a hardware effort and associated costs for providing the periodic measurement voltage can be kept low.

The term "fundamental frequency", as used in this application, shall be understood particularly as a lowest sinusoidal frequency in a Fourier analysis of the signal emitted at the modulation frequency.

In some embodiments, the microcontroller further includes an analog-to-digital converter unit comprising at least one analog-to-digital converter. An output signal of the differential amplifier and the periodic measurement voltage is connected to an input port of the at least one analog-to-digital converter. The processor unit is configured to emulate the demodulation means, the first control loop and the second control loop on the basis of the digitally converted output signals of the differential amplifier and the periodic measurement voltage by executing a predetermined program code of a software module. In this way, the hardware effort can further be reduced. In addition, the software emulation can provide flexible options of signal processing, as is known in the art.

In another aspect of the invention, a method for determining a sense current of a guard-sense capacitive sensor operated in loading mode is provided. The guard-sense capacitive sensor includes an electrically conductive sense electrode and an electrically conductive guard electrode proximally arranged and mutually galvanically separated from each other.

The method comprises steps of
providing a periodic measurement voltage to the guard electrode,
sensing a complex voltage difference between the at least one sense electrode and the guard electrode,
demodulating the complex voltage difference between the at least one sense electrode and the guard electrode by mixing the sensed complex voltage difference with the periodic measurement voltage and with a quadrature phase version of the periodic measurement voltage, respectively, and obtaining, with reference to the periodic measurement voltage, an in-phase component and a quadrature component of the output signal of the sensed complex voltage difference,
providing the in-phase component as an input signal to a first control loop and the quadrature component as an input signal to a second control loop,
generating a complex voltage by summing an output signal of the first control loop and an output signal of the second control loop, and
determining a current flowing through the sense electrode with reference to the generated complex voltage.

In another preferred embodiment, the step of generating the complex voltage comprises steps of
comparing the in-phase component to a direct current reference potential of zero V with a first integrating amplifier and comparing the quadrature component to the direct current reference potential of zero V with a second integrating amplifier,
multiplying an output signal of the first integrating amplifier with the periodic measurement voltage with a first mixer and multiplying an output signal of the second integrating amplifier with the quadrature phase version of the periodic measurement voltage with a second mixer, and
providing an output of the first mixer and an output of the second mixer to a summing circuit for generating the complex voltage.

The advantages described in context with the impedance measurement circuit in accordance with the invention also apply to the disclosed method.

In yet another aspect of the invention, a software module for carrying out steps of an embodiment of the method disclosed herein is provided.

The method steps to be conducted are converted into a program code of the software module, wherein the program code is implementable in a digital data memory unit of a microcontroller and is executable by a processor unit of the microcontroller.

The software module can enable a robust and reliable execution of the method and can allow for a fast modification of method steps.

These and other aspects of the invention will be apparent from and elucidated with reference to the embodiments described hereinafter.

BRIEF DESCRIPTION OF THE DRAWINGS

Further details and advantages of the present invention will be apparent from the following detailed description of not limiting embodiments with reference to the attached drawing, wherein.

DESCRIPTION OF THE ILLUSTRATED EMBODIMENTS

Figure 1:
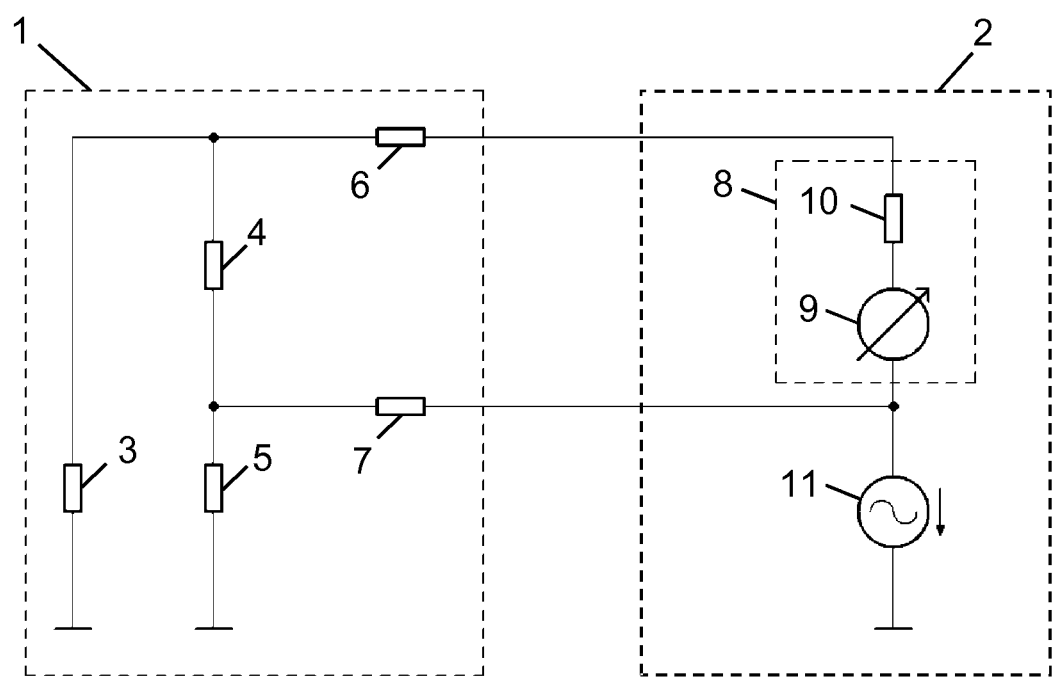
FIG. 1 illustrates an electric circuit diagram of a guard-sense capacitive sensor operated in loading mode and being connected to a conventional impedance measurement circuit for determining a sense current of the guard-sense capacitive sensor.
Figure 2:
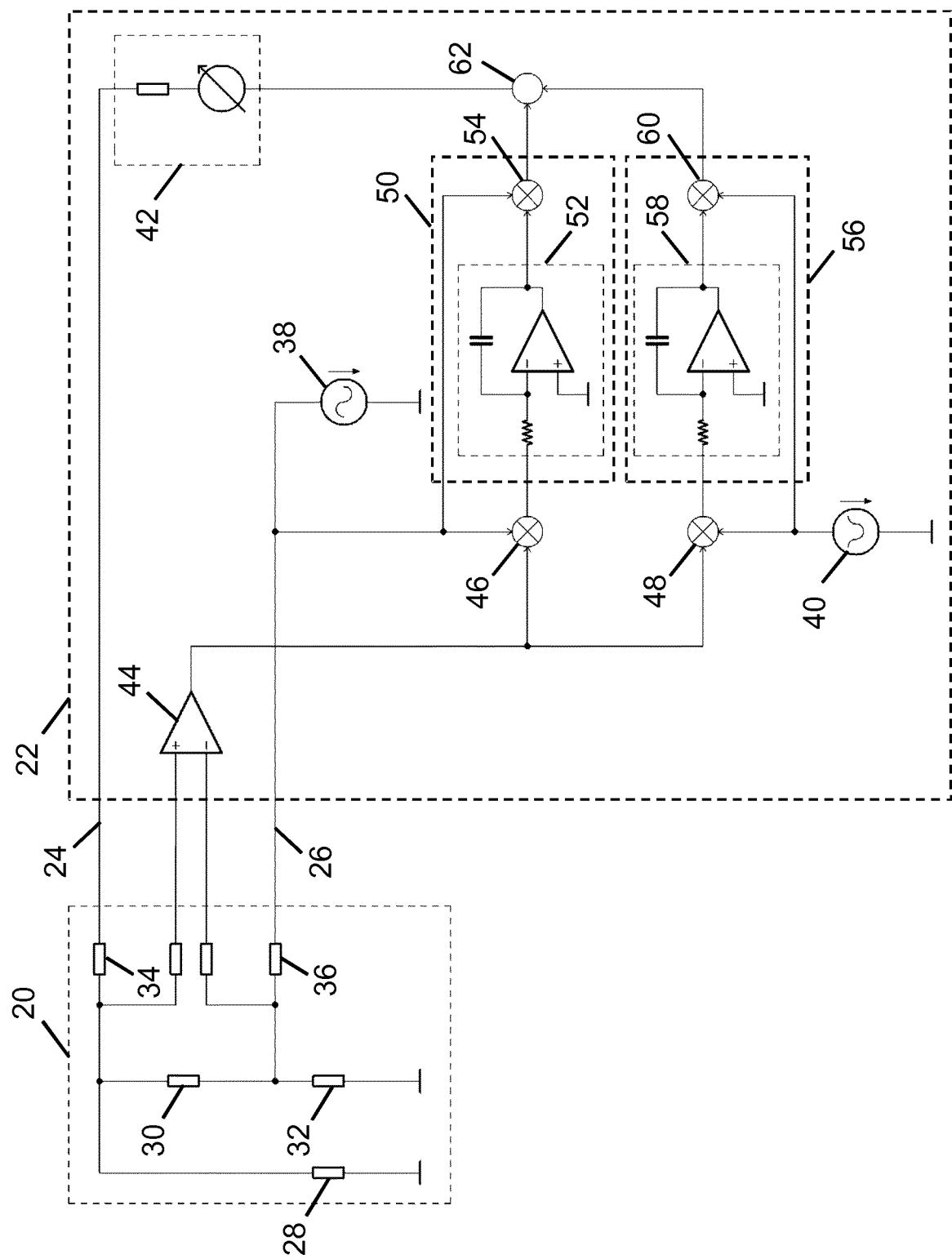
FIG. 2 illustrates an electric circuit diagram of a guard-sense capacitive sensor operated in loading mode and being connected to an impedance measurement circuit in accordance with an embodiment of the invention for determining a sense current of the guard-sense capacitive sensor.

FIG. 2 illustrates an electric circuit diagram of a guard-sense capacitive sensor 20 operated in loading mode and being electrically connected to an impedance measurement circuit 22 for determining a sense current of the guard-sense capacitive sensor 20.

The guard-sense capacitive sensor 20 includes an electrically conductive sense electrode and an electrically conductive guard electrode proximally arranged and mutually galvanically separated from each other.

In FIG. 2, the sense electrode is represented by a sense-to-guard impedance 30, and the guard electrode is represented by a guard-to-ground impedance 32. The guard-sense capacitive sensor 20 is connected to the impedance measurement circuit 22 at a sense node 24 by a sense-to-sense current measurement circuit impedance 34, and at a guard node 26 by a guard-to-signal voltage source impedance 36.

An object that approaches the sense electrode or moves away from it causes a change of the sensed current that is symbolized by an unknown impedance 28. The unknown impedance 28 is electrically connected in parallel to the sense-to-guard impedance 30 and the guard-to-ground impedance 32, which are connected in series.

The impedance measurement circuit 22 includes a periodic signal voltage source 38 that is connected to the guard node 26 for providing a periodic measurement voltage to the guard electrode, and a sense current measurement circuit 42 that is connected to the sense node 24 and is configured to determine a current flowing through the sense electrode that is indicative of the unknown impedance 28. The sensed current represents a position of the object relative to the sense electrode.

The impedance measurement circuit 22 further comprises a differential amplifier 44 whose input ports are connected to both ends of the sense-to-guard impedance 30. The differential amplifier 44 is configured to sense a complex voltage difference between the sense electrode and the guard electrode. Wiring impedances to the input ports of the differential amplifier 44 do not play a significant role as input currents of the differential amplifier 44 are negligible.

Demodulation means 46, 48 of the impedance measurement circuit 22 are formed by two electronic multiplying mixers that are both connected with one of their input ports to an output port of the differential amplifier 44. The demodulation means 46, 48 are configured for demodulating an output signal of the differential amplifier 44 and for obtaining, with reference to the periodic measurement voltage, an in-phase component and a quadrature component. To this end, a first one 46 of the two demodulation means 46, 48 is connected to the output signal of the periodic signal voltage source 38 with its other input port, and an output signal of a quadrature version 40 (i.e. with a 90° phase shift relative to an output signal of the periodic signal voltage source 38) of the periodic signal voltage source 38 is fed via a connecting line to another input port of the second one 48 of the two demodulation means 46, 48. Although shown as separate components 38, 40 in FIG. 2, it shall be understood that both the signals that are being fed to the two demodulation means 46, 48 are generated by the periodic signal voltage source 38.

By that, the first one 46 of the two demodulation means 46, 48 is configured to provide an in-phase (I) component of the output signal of the differential amplifier 44 as a first demodulation output signal. The second one 48 of the two demodulation means 46, 48 is configured to provide a quadrature (Q) component of the output signal of the differential amplifier 44 as a second demodulation output signal.

An output port of the first demodulation means 46 is connected to an input port of a first control loop 50, which, by that, is configured to receive the in-phase component as an input signal, and an output port of the second demodulation means 48 is connected to an input port of a second control loop 56, which, by that, is configured to receive the quadrature component as an input signal.

The first control loop 50 includes a first integrating amplifier 52 that is configured to generate a first error signal with reference to a direct current (DC) reference voltage at an output port, and the second control loop 56 includes a second integrating amplifier 58 that is configured to generate a second error signal with reference to the DC reference voltage at an output port.

The first control loop 50 further includes a first electronic mixer 54 whose input ports are connected to the output port of the first integrating amplifier 52 and to the output signal of the periodic signal voltage source 38, and that is configured to multiply the first error signal and the output signal of the periodic measurement voltage 38. The second loop 56 further includes a second electronic mixer 60 whose input ports are connected to the output port of the second integrating amplifier 58 and to the quadrature version 40 of the output signal of the periodic signal voltage source 38, and that is configured to multiply the second error signal and a quadrature phase of the periodic measurement voltage.

Output ports of the first control loop 50 and the second control loop 56 are connected to a summing circuit 62 of the impedance measurement circuit 22. The summing circuit 62 is therefore configured for summing the output signal of the first control loop 50 and the output signal of the second control loop 56. Means for electronically summing voltage signals, such as summing operational amplifiers with input resistors that provide voltage signals to and are connected in parallel to the inverting input port of the operational amplifier are well known to those skilled in the art, and therefore do not need to be discussed in detail herein. An output port of the summing circuit 62 is electrically connected to a reference port of the sense current measurement circuit 42.

In a slight modification of the impedance measurement circuit 22 that is not shown in FIG. 2, the summing circuit 62 comprises a summing amplifier with three input resistors, and an output port of the first electronic mixer 54, an output port of the second electronic mixer 60 and the periodic measurement voltage of the periodic signal voltage source 38 are each electrically connected to a different one of the three input resistors.

Figure 4:
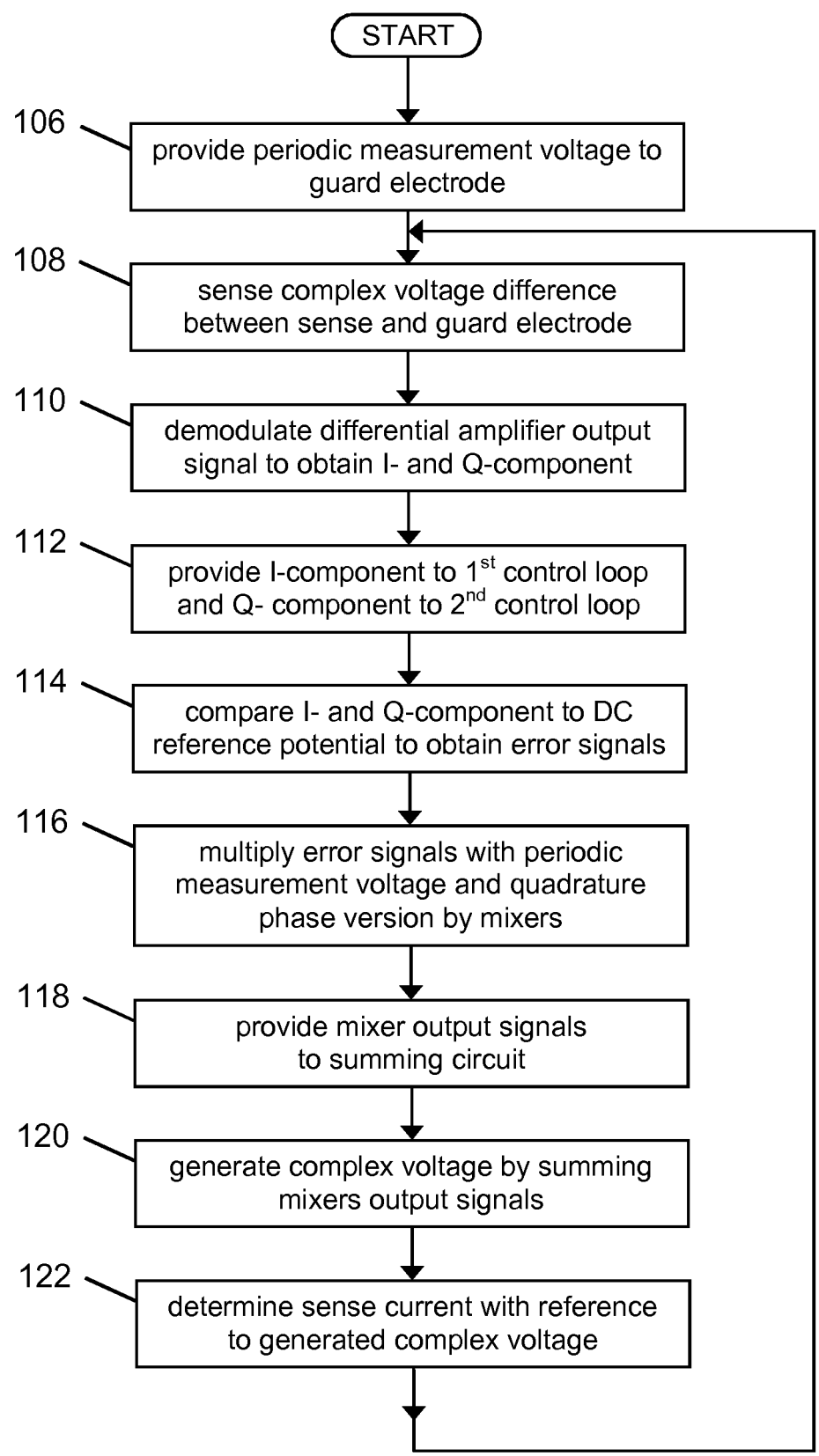
FIG. 4 is a flowchart of an embodiment of a method for determining a sense current of a guard-sense capacitive sensor operated in loading mode in accordance with the invention.

In the following, an embodiment of a method for determining the sense current of a guard-sense capacitive sensor 20 operated in loading mode will be described. A flowchart of the method is illustrated in FIG. 4. In preparation of carrying out steps of the method, it shall be understood that all involved units and devices are in an operational state and configured as illustrated in FIG. 2.

In a first step 106 of the method, a periodic measurement voltage is provided to the guard electrode by the periodic signal voltage source 38. In a next step 108, a complex voltage difference between the sense electrode and the guard electrode is sensed by the differential amplifier 44. Then, in another step 110, which is carried out by the two demodulation means 46, 48, an output signal of the differential amplifier 44 is demodulated by mixing the output signal with the periodic measurement voltage and with a quadrature phase version of the periodic measurement voltage, respectively. As a result, an in-phase component and a quadrature component of the output signal of the differential amplifier 44 with reference to the periodic measurement voltage is obtained.

Then, in another step 112 of the method, the in-phase component is provided as an input signal to a first control loop 50 and the quadrature component is provided as an input signal to a second control loop 56. In the following step 114, the in-phase component is compared to a DC reference potential of zero V by the first integrating amplifier 52 to obtain a first error signal, and the quadrature component is compared to the DC reference potential of zero V by the second integrating amplifier 58 to obtain a second error signal.

Subsequently, the first error signal of the first integrating amplifier 52 is multiplied with the periodic measurement voltage by the first electronic mixer 54 and the second error signal of the second integrating amplifier 58 is multiplied with the quadrature phase version of the periodic measurement voltage by the second electronic mixer 60 in another step 116. The amplitude and sign of the outputs of the electronic mixers 54, 60 are therefore dependent on the first and the second error signal of the integrating amplifiers 52, 58.

In the following step 118, an output of the first electronic mixer 54 and an output of the second electronic mixer 60 is provided to the summing circuit 62. The summing circuit 62, in another step 120, generates a complex voltage by summing the output of the first electronic mixer 54 and the output of the second electronic mixer 60. As the output port of the summing circuit 62 is connected to the reference port of the sense current measurement circuit 42, the generated complex voltage serves as the complex reference voltage for the sense current measurement circuit 42. By that, the first control loop 50 and the second control loop 56 cooperate to force a complex input voltage of the differential amplifier 44 to an amplitude of zero volts and a phase difference of 0°.

In a last step 122 of the method, the sense current measurement circuit 42 determines the current flowing through the sense electrode with reference to the generated complex voltage.

It will be readily appreciated by those skilled in the art that, although the method has been described in discrete steps for illustration purposes, the sense current is determined in a continuous manner, as all involved variables are measured and processed in an analog way.

Figure 3:
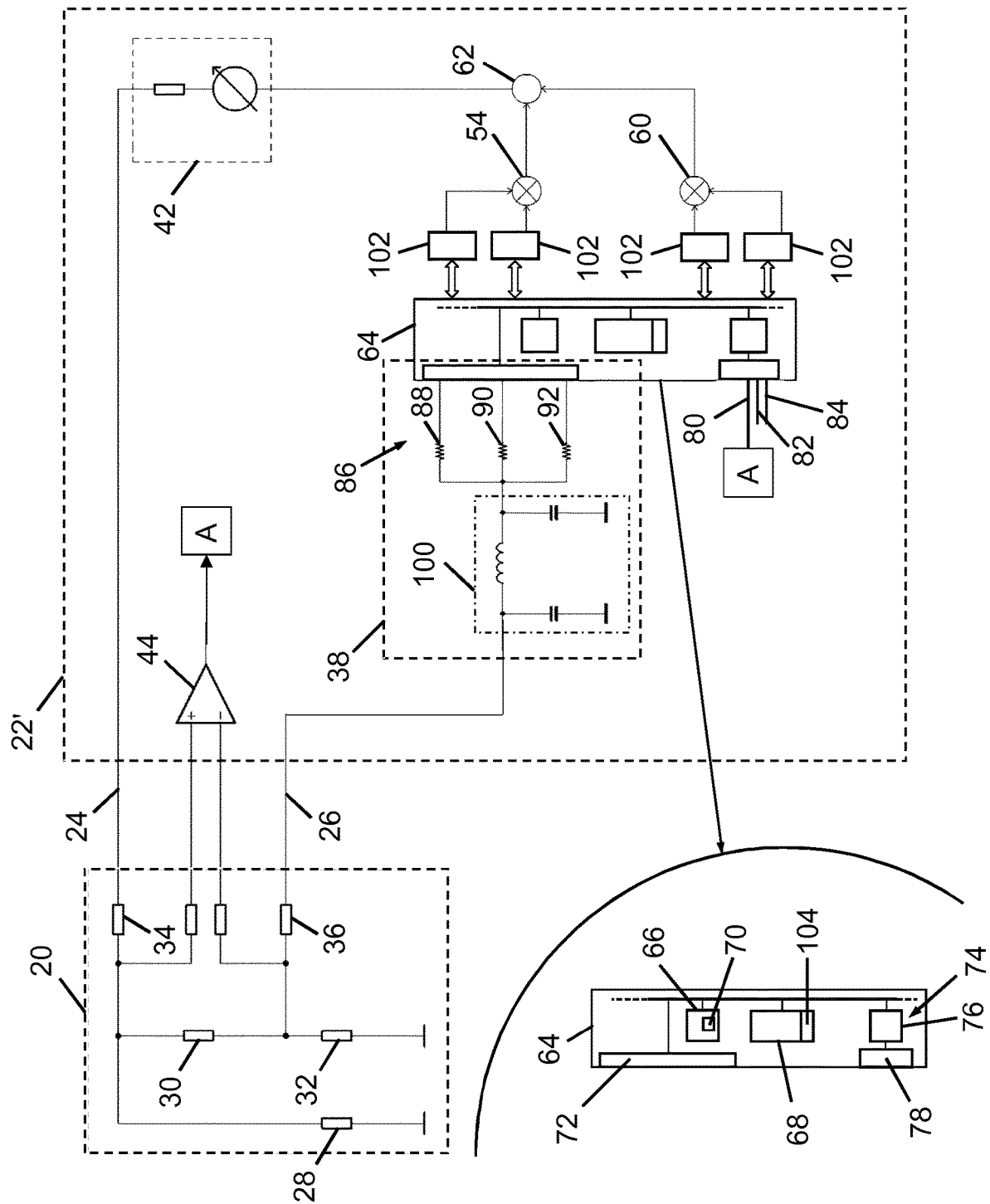
FIG. 3 illustrates an electric circuit diagram of the guard-sense capacitive sensor pursuant to FIG. 2, operated in loading mode and being connected to an alternative embodiment of the impedance measurement circuit in accordance with the invention.

FIG. 3 illustrates an electric circuit diagram of the guard-sense capacitive sensor 20 pursuant to FIG. 2, operated in loading mode and being electrically connected to an alternative embodiment of the impedance measurement circuit in accordance with the invention. The focus for the alternative impedance measurement circuit is on cost-effectiveness. For distinction purposes, the alternative impedance measurement circuit is denoted by 22'. For brevity, only differences to the embodiment disclosed beforehand will be described.

The impedance measurement circuit 22' comprises a microcontroller 64 that includes a processor unit 66, a digital data memory unit 68 to which the processor unit 66 has data access, a microcontroller system clock 70, a plurality of three synchronized pulse width modulation (PWM) units 72 with square wave output signals and an analog-to-digital converter unit 74. The analog-to-digital converter unit 74 comprises a single analog-to-digital converter 76 and a signal multiplexer 78, wherein the signal multiplexer 78 is configured, controlled by the processor unit 66, to switch input ports 80, 82, 84 of a plurality of input ports (only three input ports shown in FIG. 3) of the analog-to-digital converter unit 74 to an input port of the single analog-to-digital converter 76. The analog-to-digital converter 76 is configured to be triggered by an additional clock source of the microcontroller 64, formed by another PWM unit (not shown). It is understood that data links (indicated in FIG. 3 as a data bus) exist that mutually connect the various components of the microcontroller 64.

The impedance measurement circuit 22' further comprises a pulse generator unit 86 that is configured to weight and to sum output signals 94, 96, 98 (FIG. 5) of the plurality of synchronized PWM units 72 having same fundamental signal frequency. The adjustable fundamental signal frequency generally lies in a range between 10 kHz and 500 kHz, and is selected in this specific embodiment to be 100 kHz. It should however be noted that in principle the adjustable fundamental signal frequency can also be more than 500 kHz, e.g. 7 MHz.

Referring again to FIG. 3, the pulse generator unit 86 comprises three resistors 88, 90, 92, each resistor 88, 90, 92 being connected to an output port of one of the three PWM units 72, for weighted summing of all the PWM unit output signals 94, 96, 98.

Figure 5:
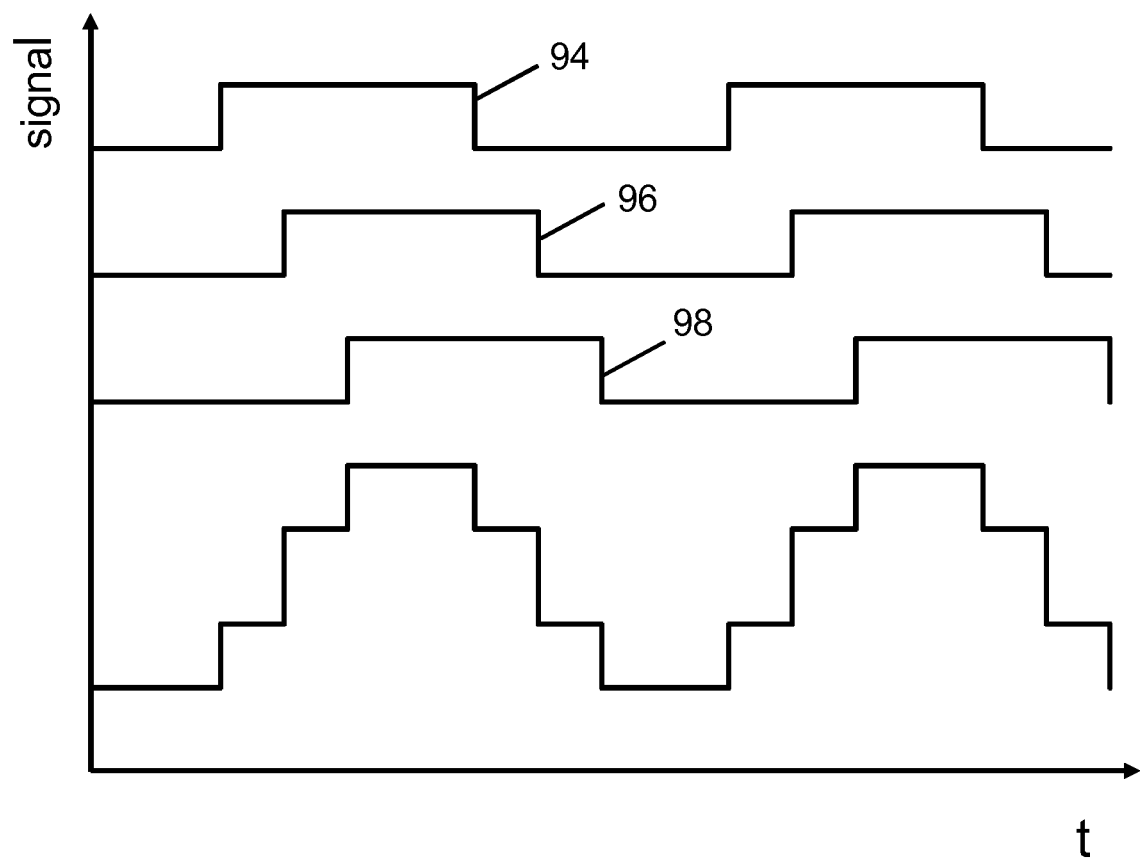
FIG. 5 shows a combination of a plurality of synchronized output signals of same fundamental signal frequency, generated by synchronized pulse width modulation units of the microcontroller of the impedance measurement circuit pursuant to FIG. 3.

The square wave output signals 94, 96, 98 of the pulse width modulation units 72 are schematically shown in FIG. 5. The output signals 94, 96, 98 have the same fundamental signal frequency, with a defined relative phase shift among them. PWM unit output signal 96 is delayed by ⅛ period relative to PWM unit output 94, and PWM unit output signal 98 in turn is delayed by ⅛ period relative to PWM unit output signal 96. The relative amplitudes of the PWM unit output signals 94, 96, 98 as weighted by the resistors are 1, $\sqrt{2}/2$ and 1, respectively. By summing the weighted PWM unit output signals 94, 96, 98, an approximated sine wave is generated as indicated in the bottom part of FIG. 5. The $2^{nd}$ to $7^{th}$ harmonics of the approximated sine wave are substantially suppressed.

A low-pass filter unit 100, designed as an LC-filter in π-configuration (FIG. 3), is connected in series to the output of the pulse generator unit 86 and substantially filters out most of the remaining harmonics. The output of the low-pass filter unit 100 is a sinusoidal periodic measurement voltage having a frequency of 100 kHz and a low distortion factor. The pulse generator unit 86 and the low-pass filter unit 100 form the periodic signal voltage source 38.

The output port of the differential amplifier 44 is connected to the input port of the analog-to-digital converter 76, and the processor unit 66 is configured to emulate the demodulation means, the first control loop and the second control loop on the basis of the digitally converted output signals of the differential amplifier 44 and the periodic measurement voltage by executing a predetermined program code of a software module 104, on the basis of the periodically sampled and digitally converted voltages. For the purpose of driving the electronic mixers 54, 60, the microcontroller 64 includes a plurality of digital-to-analog converters 102.

The software module 104 is also provided for carrying out steps of an embodiment of the disclosed method for determining a sense current of the guard-sense capacitive sensor 20 operated in loading mode. The method steps 110-114 to be conducted are converted into a program code of the software module 104. The program code is implementable in the digital data memory unit 68 of the microcontroller 64, and is executable by the processor unit 66 of the microcontroller 64.

Further cost savings can be achieved by implementing the first electronic mixer and the second electronic mixer by two Single-Pole Double-Throw (SPDT) analog switches, which are commercially available in many variations. Alternatively, if available, unused pulse width modulation (PWM) units of the microcontroller with filtered square wave output signals could be employed to this end. Two passive low pass filters may follow the SPDT analog switches in order to convert the square waves generated by the SPDT switches into sine waves. Implementations of the proposed further cost savings are not shown in FIG. 3.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. An impedance measurement circuit for determining a sense current of a guard-sense capacitive sensor operated in loading mode including an electrically conductive sense electrode and an electrically conductive guard electrode proximally arranged and mutually galvanically separated from each other, the impedance measurement circuit including a periodic signal voltage source that is configured to provide a periodic measurement voltage to the guard electrode, a sense current measurement circuit that is configured to determine a current flowing through the sense electrode that is indicative of an unknown impedance and represents a position of an object relative to the sense electrode, a differential amplifier that is configured to sense a complex voltage difference between the sense electrode and the guard electrode, demodulation means that are configured for demodulating an output signal of the differential amplifier and for obtaining, with reference to the periodic measurement voltage, an in-phase component and a quadrature component, a first control loop that is configured to receive the in-phase component as an input signal, and a second control loop that is configured to receive the quadrature component as an input signal, wherein an output signal of the first control loop and an output signal of the second control loop are used to form a complex voltage that serves as a complex reference voltage for the sense current measurement circuit.

2. The impedance measurement circuit as claimed in claim 1, wherein the first control loop includes a first integrating amplifier that is configured to generate a first error signal with reference to a direct current reference voltage, and the second control loop includes a second integrating amplifier that is configured to generate a second error signal with reference to the direct current reference voltage.

3. The impedance measurement circuit as claimed in claim 2, wherein the first control loop further includes a first mixer that is configured to multiply the first error signal and the periodic measurement voltage, and the second control loop further includes a second mixer that is configured to multiply the second error signal and a quadrature phase of the periodic measurement voltage.

4. The impedance measurement circuit as claimed in claim 3, further comprising a summing circuit that is configured for at least summing the output signal of the first control loop and the output signal of the second control loop to form the complex voltage that serves as the complex reference voltage for the sense current measurement circuit.

5. The impedance measurement circuit as claimed in claim 4, wherein the summing circuit is configured for at least summing the output signal of the first control loop and the output signal of the second control loop and the periodic signal voltage source to form the complex voltage that serves as the complex reference voltage for the sense current measurement circuit.

6. The impedance measurement circuit as claimed in claim 1, comprising a microcontroller, including a processor unit (66), a digital data memory unit to which the processor unit (66) has data access, a microcontroller system clock, a plurality of synchronized pulse width modulation units configured to provide square wave output signals, and wherein the periodic signal voltage source is formed by a pulse generator unit that is configured to weight and to sum output signals of the plurality of synchronized pulse width modulation units having same fundamental signal frequency, and a low-pass filter unit that is connected in series to an output of the pulse generator unit and that is configured to filter the summed output signals for generating the periodic measurement voltage.

7. The impedance measurement circuit as claimed in claim 6, the microcontroller further including an analog-to-digital converter unit comprising at least one analog-to-digital converter, wherein an output port of the differential amplifier and the periodic measurement voltage are connected to an input port of the at least one analog-to-digital converter, and the processor unit (66) is configured to emulate the demodulation means, the first control loop and the second control loop on the basis of the digitally converted output signals of the differential amplifier and the periodic measurement voltage by executing a predetermined program code of a software module.

8. The impedance measurement circuit as claimed in claim 1, wherein the sense electrode is electrically connected to the sense current measurement circuit, the guard electrode is electrically connected to an output port of the periodic signal voltage source, one input port of the differential amplifier is electrically connected to the sense electrode, and one input port of the differential amplifier is electrically connected to the guard electrode.

9. The impedance measurement circuit as claimed in claim 6, wherein the processor unit is configured to carry out the steps of:

demodulating the complex voltage difference between the sense electrode and the guard electrode by mixing the sensed complex voltage difference with the periodic measurement voltage and with a quadrature phase version of the periodic measurement voltage, respectively, and obtaining, with reference to the periodic measurement voltage, an in-phase component and a quadrature component of the sensed complex voltage difference, providing the in-phase component as an input signal to a first control loop and the quadrature component as an input signal to a second control loop, and generating a complex voltage by summing an output signal of the first control loop and an output signal of the second control loop.

10. A method for determining a sense current of a guard-sense capacitive sensor operated in loading mode, the guard-sense capacitive sensor including an electrically conductive sense electrode and an electrically conductive guard electrode proximally arranged and mutually galvanically separated from each other, the method comprising steps of (a) providing a periodic measurement voltage to the guard electrode, (b) sensing a complex voltage difference between the sense electrode and the guard electrode, (c) demodulating the complex voltage difference between the sense electrode and the guard electrode by mixing the sensed complex voltage difference with the periodic measurement voltage and with a quadrature phase version of the periodic measurement voltage, respectively, and obtaining, with reference to the periodic measurement voltage, an in-phase component and a quadrature component of the sensed complex voltage difference, (d) providing the in-phase component as an input signal to a first control loop and the quadrature component as an input signal to a second control loop, (e) generating a complex voltage by summing an output signal of the first control loop and an output signal of the second control loop, and (f) determining a current flowing through the sense electrode with reference to the generated complex voltage.

11. The method as claimed in claim 10, wherein the step of generating the complex voltage comprises steps of comparing the in-phase component to a direct current reference potential of zero V with a first integrating amplifier and comparing the quadrature component to the direct current reference potential of zero V with a second integrating amplifier, multiplying an output signal of the first integrating amplifier with the periodic measurement voltage with a first mixer and multiplying an output signal of the second integrating amplifier with the quadrature phase version of the periodic measurement voltage with a second mixer, and providing an output of the first mixer and an output of the second mixer to a summing circuit for generating the complex voltage.

12. A non-transitory, computer readable medium for carrying out steps of the method as claimed in claim 10 for determining a sense current of a guard-sense capacitive sensor operated in loading mode, wherein method steps (c) through (e) are stored on the computer readable medium as program code that is executable by a processor unit of the microcontroller.

* * * * *